(12) United States Patent
Davis et al.

(10) Patent No.: US 11,680,992 B2
(45) Date of Patent: Jun. 20, 2023

(54) BATTERY WATERING STATUS SYSTEM

(71) Applicants: James Kenneth Davis, Clemmons, NC (US); John Robert Soares, Clemmons, NC (US)

(72) Inventors: James Kenneth Davis, Clemmons, NC (US); John Robert Soares, Clemmons, NC (US)

(73) Assignee: Fourshare LLC, Clemmons, NC (US)

(*) Notice: Subject to any disclaimer, the term of this patent is extended or adjusted under 35 U.S.C. 154(b) by 155 days.

(21) Appl. No.: 17/190,766

(22) Filed: Mar. 3, 2021

(65) Prior Publication Data

US 2021/0280953 A1 Sep. 9, 2021

Related U.S. Application Data

(60) Provisional application No. 62/986,049, filed on Mar. 6, 2020.

(51) Int. Cl.
*G01R 31/396* (2019.01)
*B01J 8/18* (2006.01)

(52) U.S. Cl.
CPC .............. *G01R 31/396* (2019.01); *B01J 8/18* (2013.01)

(58) Field of Classification Search
CPC ....... G01R 31/396; B01J 8/18; H01M 10/425; H01M 50/609; H01M 50/618; H01M 50/627; H01M 50/673; H01M 10/48
See application file for complete search history.

(56) References Cited

U.S. PATENT DOCUMENTS

| | | | | |
|---|---|---|---|---|
| 5,184,309 | A * | 2/1993 | Simpson | B67D 7/425 141/392 |
| 5,365,984 | A * | 11/1994 | Simpson | B67D 7/425 141/206 |
| 10,326,171 | B2 * | 6/2019 | Herrema | H01M 10/484 |
| 2006/0281000 | A1 * | 12/2006 | Hayashigawa | B66F 9/24 429/50 |
| 2011/0236730 | A1 * | 9/2011 | Jones | H01M 50/673 429/61 |
| 2015/0295223 | A1 * | 10/2015 | Kang | H01M 50/627 429/74 |

* cited by examiner

*Primary Examiner* — Giovanni Astacio-Oquendo
*Assistant Examiner* — Dilara Sultana
(74) *Attorney, Agent, or Firm* — Robert W. Pitts

(57) ABSTRACT

A system for watering an electrolyte or lead acid battery in which the cumulative amount of water added during each filling event is determined by detecting the amount of water passing from a supply hose to the battery. A fluid dispensing member, such as a direct fill link or nozzle, can be attached to and detached from a single point watering subsystem. A flow detector, such as a flow meter, in fluid communication with the fluid dispensing member can wirelessly output the cumulative water added to specific batteries to an interactive computer application, which can include a wireless component such as a smartphone or tablet communicating with a remotely located interactive database.

32 Claims, 10 Drawing Sheets

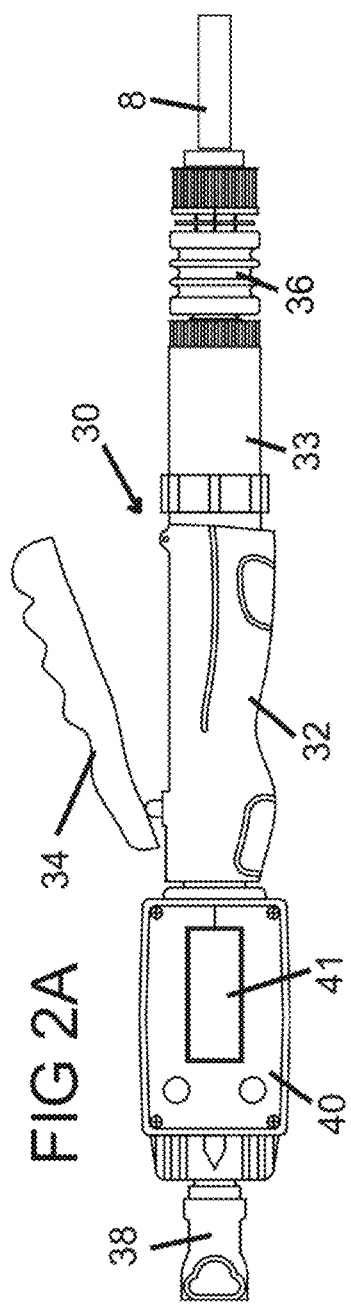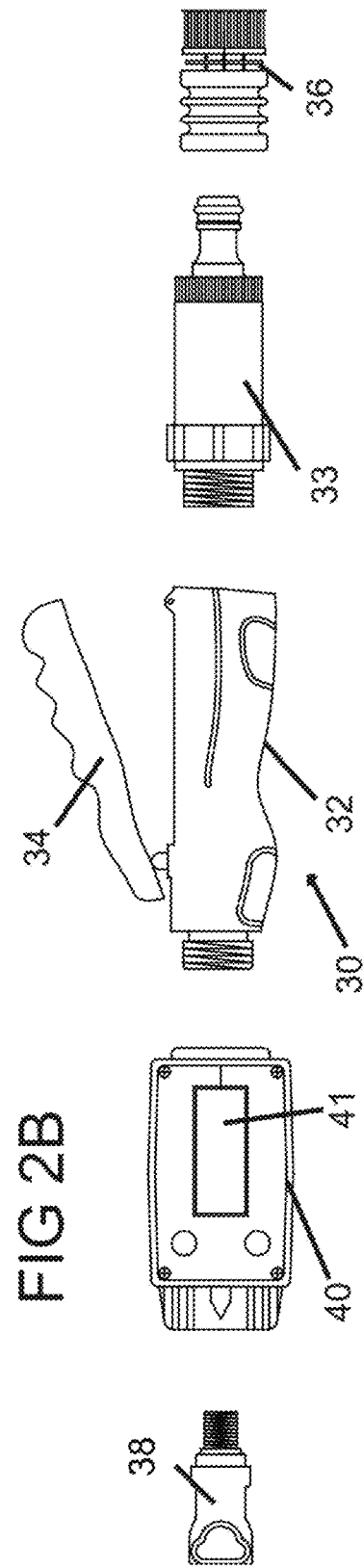

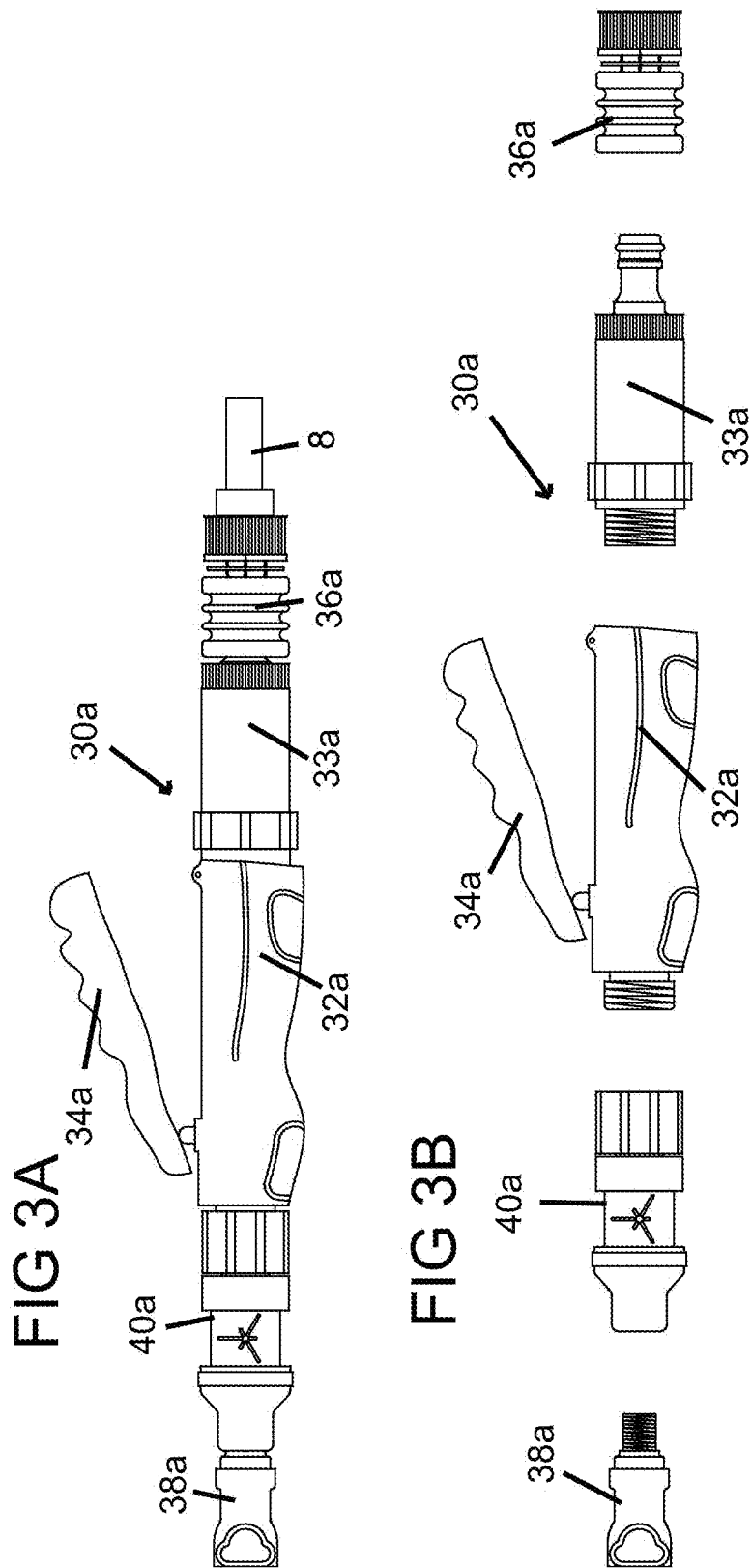

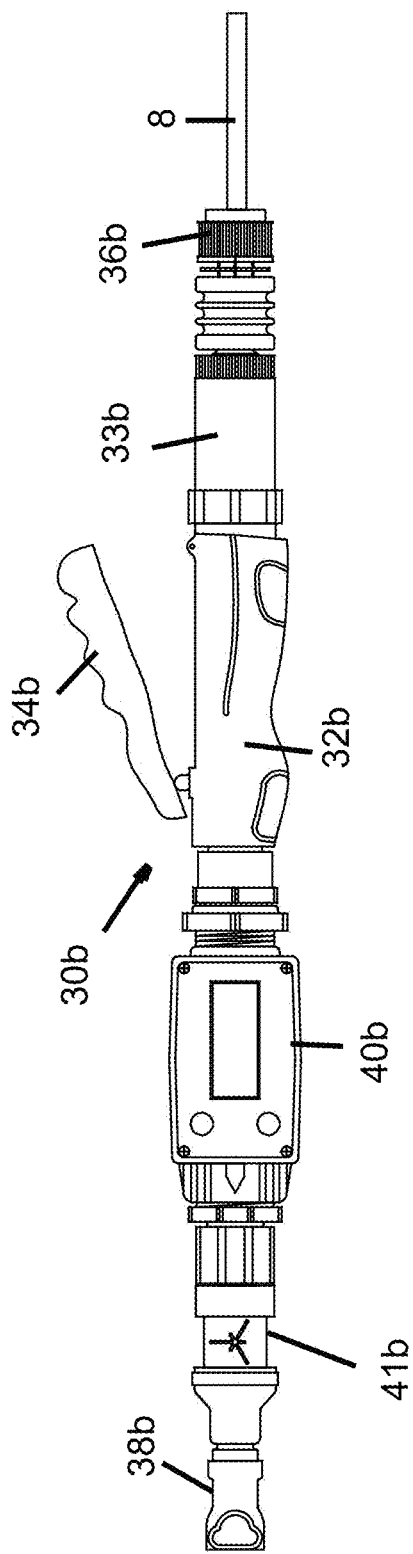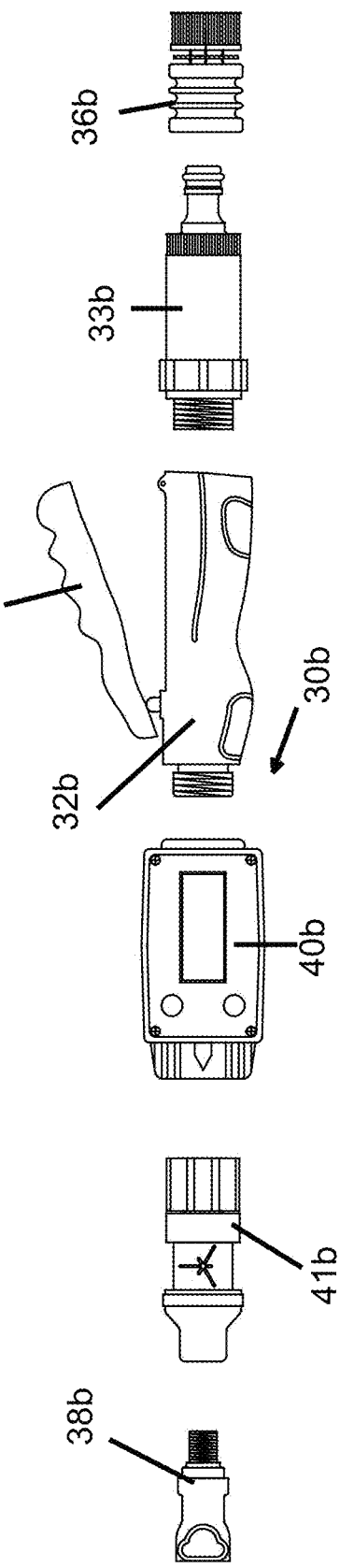
FIG 4A
FIG 4B

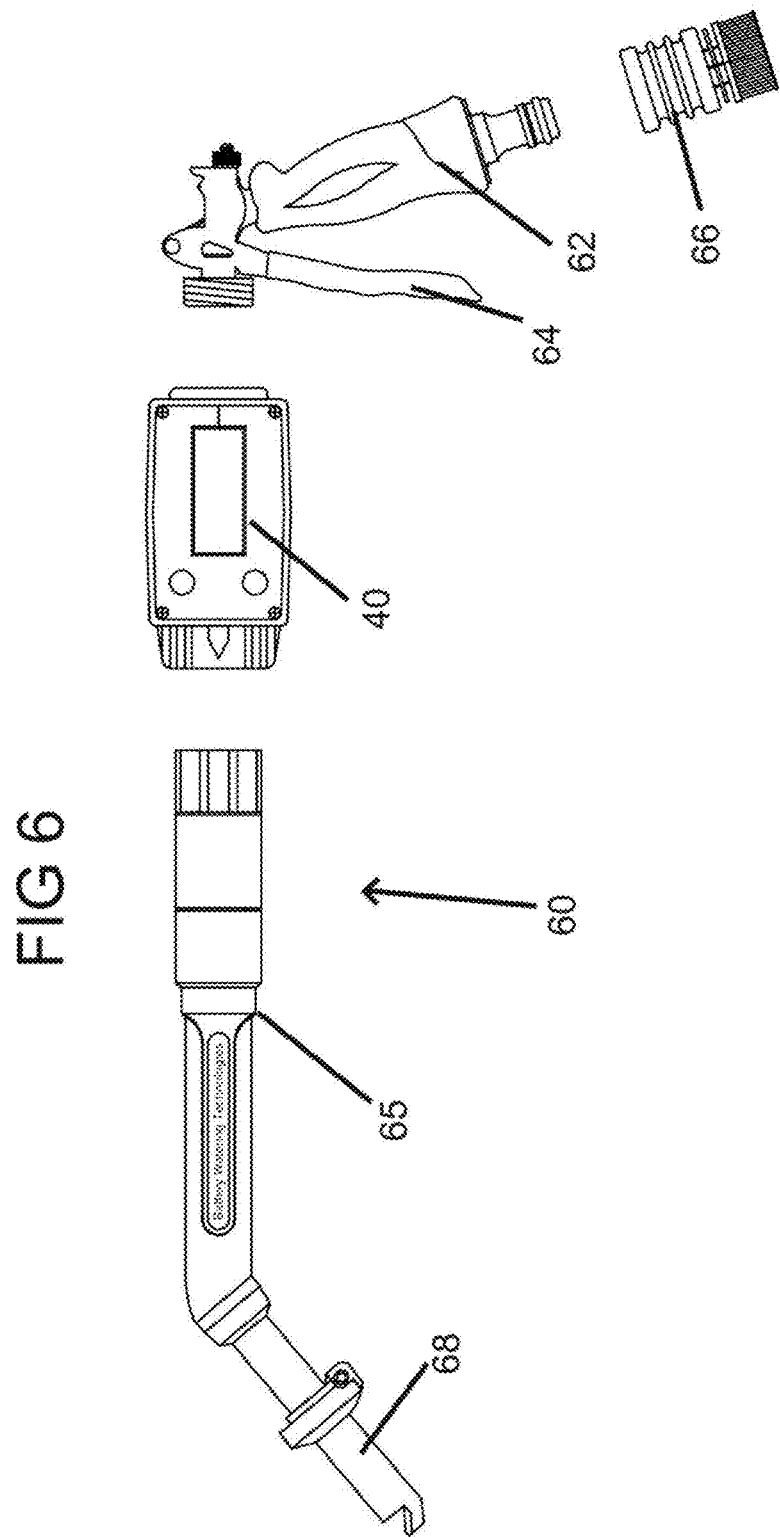

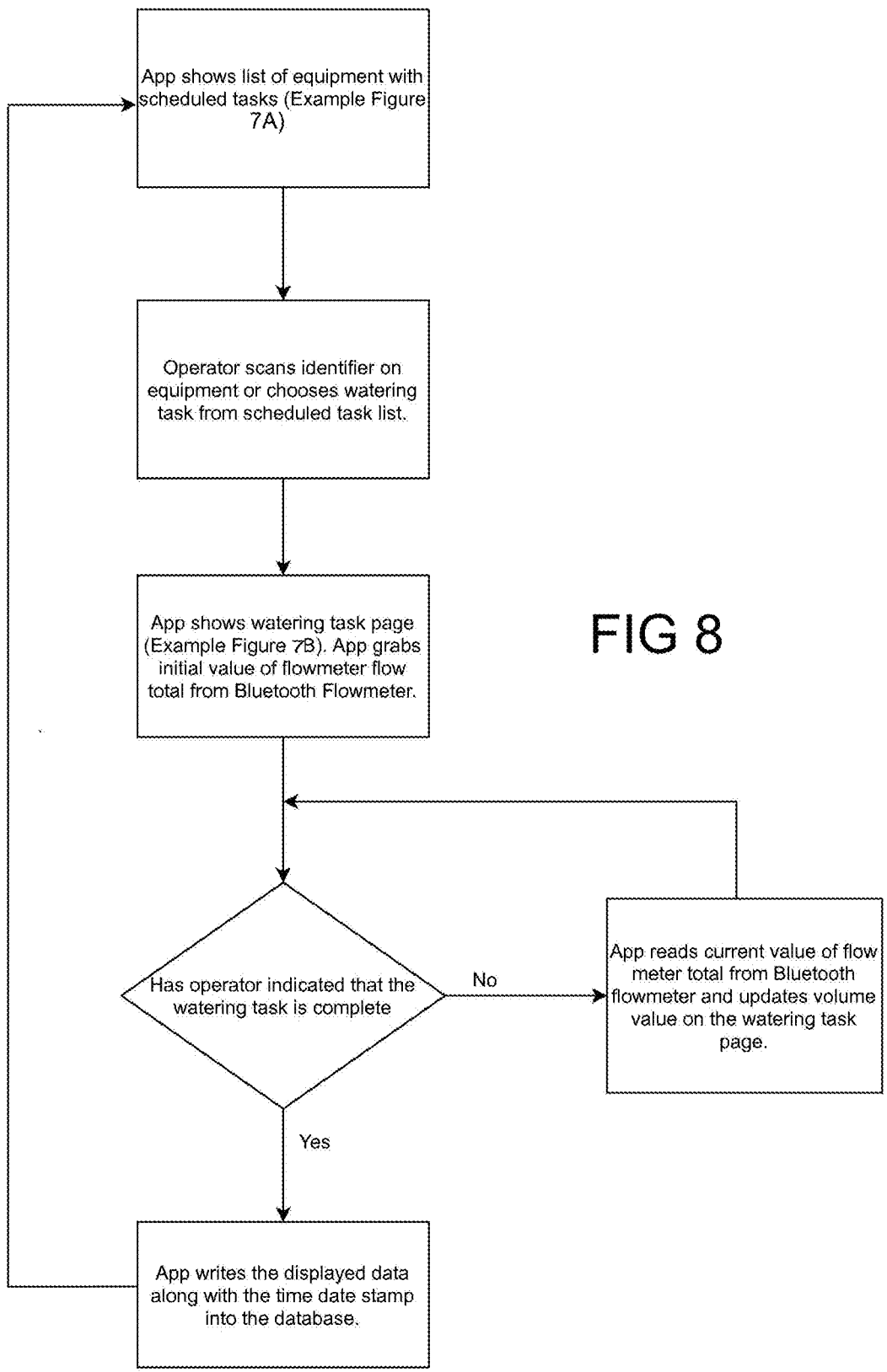

BATTERY WATERING STATUS SYSTEM

CROSS REFERENCE TO PRIOR APPLICATION

This application claims the benefit of U.S. Provisional Patent Application 62/986,049 filed on Mar. 6, 2020, the contents of which are incorporated herein by reference.

BACKGROUND OF THE INVENTION

Field of the Invention

This invention relates to an apparatus and method for adding water to liquid electrolyte batteries of the type used to provide continuous electrical energy, draining the battery, to self powered vehicles, such as fork trucks and golf carts, and also to maintain a continuous record of relevant activities, such as periodic watering dates and quantities, for each battery employed in a facility or fleet.

Description of the Prior Art

Flooded batteries need periodic refilling or topping up of the electrolyte by adding water to the cells, bringing the electrolyte level to a specified level. There are several ways to accomplish this.

Watering systems for flooded batteries are well established in practice and simplify this topping up procedure. A battery is shown in FIG. 1. These watering systems consist of cell refill valves, one for each cell. These valves are connected together with tubing through a common feed tube that allows water to flow to each valve from a single water connection point. This is the source of the common name for these systems, which are each known as a "Single Point Watering System". These single point watering systems are connected to a water source though a quick connect coupling. The water source could be gravity or pump fed or could just be a hose bib connected to a municipal water source. The connection device, called a watering link, will consist of at least the mating quick connect coupling and may also include a pressure regulator, a flow indicator and a flow control handle. In a typical watering event, the operator, who is the individual performing the watering event and/or using the system and the app or program for identifying what battery is to be filled, would connect the watering link to the watering system on a battery using the quick connect coupling feature. Once connected, the operator would actuate the flow control handle to allow water to flow. The operator would observe the flow indicator to determine when flow has stopped and watering was complete. The operator would then disconnect the quick connect coupling, record any required data related to the watering event and move to the next battery needing water.

In some facilities, watering of batteries or topping off electrolyte is accomplished without a single point watering system by using a watering gun. A watering gun is similar to a watering link except that instead of a quick connect at the end, it has a nozzle for filling each cell, one at a time. The nozzle is specially constructed to shutoff when the electrolyte level reaches the bottom tip of the nozzle. The operator would remove all the battery cell caps and then insert the nozzle into the first cell, actuate the flow control handle to allow water to flow and then waits for the nozzle to shut off. The operator then releases the flow control actuator and moves the nozzle to the next cell and repeats the process. When all cells have been watered and the battery watering is complete, the operator would replace the battery caps and record any required data related to the watering event and move to the next battery needing water.

Recording the watering event is important because severe damage can occur to a flooded battery if the electrolyte levels drops too low. Examples of how the watering event might be recorded are, a watering calendar attached to the battery case, a log sheet that is filed at the end of the day or a computer preventative maintenance tracking application that might schedule and record the event. Reviewing this data is important to make sure all batteries have been properly maintained.

A battery monitoring system for use with liquid electrolyte batteries is disclosed in U.S. Pat. No. 10,326,171. This system employs an on-board control module mounted on each battery that communicates with a network of sensors including an inline flow rate sensor and a separate pressure sensor to monitor the condition and performance of each battery. The control module on each battery includes an internal controller that can include a microprocessor, or an application specific circuit (ASIC) or a field programmable gate array (FPGA). On each battery, the inline flow rate sensor and the separate pressure sensor with inputs and outputs are mounted on an input feed tube mounted on the battery. All of the fluid, typically water that is injected into the individual battery cells, flows through this input feed tube. Branch feed tubes can extend to individual or different battery cells, which each are to be filled. The output of this flow rate sensor is then electrically input to a battery mounted controller, which also receives input from other sensors, such as current and voltage sensors, liquid level sensors and a dirty battery sensor, as well as an accelerometer, which is part of the controller. In this prior art system disclosed in this patent a number of sensors and a control module must be mounted on each battery in order to supply data to a stand-alone programmable interface, such as a smartphone or a tablet, which then communicates with a server. The amount of fluid added to that battery, on which the flow rate sensor and controller are mounted, is then determined as a function of the sensed flow rate and the time during which the flow rate exceeds a prescribed minimum flow rate. The control module on each battery then shares that data with a standalone device over a wireless network, such as a Bluetooth network or a Zigbee network. With the system disclosed in U.S. Pat. No. 10,326,171, each battery must be equipped with the requisite sensors, specifically the flow rate sensor, and a battery mounted controller. Furthermore, it would appear that this prior art system could not be used with batteries equipped with commonly available single point watering systems that do not employ the battery mounted flow rate sensors and the controller required for the system disclosed in U.S. Pat. No. 10,326,171. Since each battery to be monitored must be provided with its own flow rate sensor and controller, the cost of these extra components is multiplied by the number of batteries in the fleet or facility to be monitored.

Several computer programs are available that allow the user to schedule and track battery maintenance. In most cases, a battery watering event is logged with the name of the operator performing the watering and the time/date stamp for the event. The operator may enter notes related to the event but there is no direct feedback of how much water was put into the battery. It is advantageous to have some form of process data recorded with the watering. By reviewing the amount of water added (or the amount of time water flowed), indications of the health of the battery can be determined. Process data such as this also builds confidence that the watering occurred as it should and the watering equipment is functioning as expected.

Most of these computerized preventative maintenance tracking programs are being written to be accessed by smartphones and tablets in the field. This allows field communication back to an Internet based server using readily available and relatively inexpensive equipment. Smartphone and tablet almost always include interfaces for not only cellular communication but also WiFi, Bluetooth Low Energy and sometimes ZigBee.

SUMMARY OF THE INVENTION

A system for monitoring and intermittently watering a fleet of multiple batteries, especially motive power batteries, one at a time can include a water delivery device, nozzle or injector (watering link or watering gun) that supplies water to flooded batteries. A flow sensor is in line or a part of this water delivery device. This flow sensor can contain wireless network hardware to allow process data communication from the flow sensor. A computer application that can run on a smartphone or tablet and can schedule and record maintenance events for a particular battery is employed with this. The computer application is also able to read the process data being transmitted wirelessly from the flow meter in order to record the process data being transmitted. A process within the computer application where a watering event is being logged, the application will connect to the flow sensor wirelessly in order to read the process data and include the process data in the record created for the watering event.

According to one aspect of this invention, an apparatus is provided for sequentially refilling multiple batteries with a fluid. Each battery has a plurality of cells which are individually refillable. The apparatus includes a flow meter and a pressure regulator attachable to each other between a hose and a nozzle. The flow meter is capable of measuring the cumulative flow input to all of the plurality of cells in each of the batteries, one battery at a time, through the fluid dispensing member, such as a nozzle. The flow meter or flow totalizer will also generate a signal corresponding to the total amount of fluid passing through the nozzle and detected by the flow meter to fill each of the batteries, one at a time. This signal can be detected by an operator, either visually or automatically after refilling each battery to document the amount of fluid added to each of the batteries. This apparatus is employable as part of a batch process for refilling multiple batteries individually suitable for installation in a vehicle or as part of servicing an individual vehicle employing as least one of the multiple batteries. According to this aspect of the invention the invention may include a nozzle or the apparatus can be attached to a standard nozzle that could be used without the flow meter and pressure regulator.

According to another aspect of this invention, an apparatus for refilling multiple batteries with a fluid includes a nozzle shiftable between a closed position and an open position. A nozzle fitting attaches one end of the nozzle to a supply hose, and a nozzle outlet is located on the opposite end of the nozzle. A flow meter on the nozzle detects fluid passing through the flow meter and passing through the nozzle to determine the cumulative flow through the flow meter. A flow meter data output member outputs the total amount of fluid passing through the flow meter and the nozzle during an operative state or between opening and closing the nozzle at the beginning and end of the watering event. A communication interface transmits a signal corresponding to the total amount of fluid passing through the flow meter on the nozzle to an interactive data record of multiple instances in which each of the multiple batteries is refilled.

According to another aspect of this invention, a system using this apparatus monitors and intermittently waters a fleet of multiple batteries one at a time. Each battery includes a plurality of individual battery cells, each which may require replenishment of possibly different amounts of water. Individual batteries are equipped with a battery watering assembly comprising a plurality of valves positionable in battery cell vent openings. Individual valves are shiftable between an open position to allow fluid to enter a battery cell and a closed position when the fluid level in the individual battery cell reaches a prescribed level. A single input opening on a single fluid input feed tube communicates with branch feed tubes leading to individual valves so that fluid is introduced through the single input tubing to the branch tubing and the individual valves only through the single fluid input opening. Fluid flow through the feed tubing ceases after all valves in communication with the conduits are closed. This system includes a fluid dispensing member, such as a nozzle attached to a water supply hose. The nozzle is shiftable between a closed position and an open position allowing the fluid to pass through the nozzle. A nozzle fitting attaches the nozzle to a water supply hose supplying the fluid for intermittently refilling the individual batteries sequentially and one at a time. A nozzle outlet delivers water to the input feed tube of individual batteries when placed in communication with the input feed tube on each individual battery. A flow meter is mounted in the fluid dispensing member or nozzle and in fluid communication with the nozzle. The flow meter includes a flow rate sensor for determining the flow through the nozzle bore. A flow meter data output member outputs the total amount of fluid passing through the bore of the flow meter and the nozzle between opening and closing the nozzle. A communication interface provides data corresponding to the total amount of fluid passing through the nozzle measured by the flow meter to a data record of multiple instances in which each of the multiple batteries were watered. An interactive database communicable with the communication interface stores the time and amount of water added to each individual battery. Distinct indicia on individual batteries identify each battery to the interactive database.

A method according to another aspect this invention monitors the refilling a fleet of liquid electrolyte batteries each equipped with fill tubes and valves mounted on the battery and delivering water through valves to all cells in the battery. The fill tubes include a single input fill tube and branch fill tubes leading from the input fill tube to the cells. The steps of this method include intermittently connecting a fluid dispensing member, such as a nozzle attached to a water supply hose to the single input fill tube on individual batteries, one at a time. The nozzle is then opened and injecting water is injected through the single input fill tube until all of the cells are filled. The flow is passing through the nozzle is then measured by a flow meter mounted on the nozzle. The cumulative flow required to fill all of the cells on the battery to which the nozzle is attached is then output, from the flow meter, and the cumulative flow data is communicated to an interactive external database storing information for the battery being filled and other batteries in the fleet. These steps are then repeated for other batteries in the fleet.

The improved apparatus, system and method according to this invention is nevertheless suitable for use in the various typical situations in which standard, refillable electrolyzed batteries are currently employed. Furthermore this invention is compatible with the standard manner in which a technician or operator currently performs the refilling tasks, and does not require any modification of or addition to the battery. An operator would use a direct fill link to refill batteries equipped with a single point watering system in the same way that he currently does his job. The operator would use a watering gun to fill all of the battery cells individually if the battery was not equipped with a single point watering system. The difference is not with the battery or the single point watering system, but with the devices used in the same manner as conventional direct fill links and watering guns. The same new fluid dispensing direct fill links and watering guns according to this invention can be used for refilling batteries used on vehicles as part of standard service of the vehicle or at the same time in which such vehicle batteries are now refilled. These same new fluid dispensing direct fill links and watering guns could also be used in a battery room where batteries are stored and refilled for periodic replacement in vehicle, such as fork lifts. These same new fluid dispensing direct fill links and watering guns according to this invention can also be used on hoses where water is currently available in a plant or other facility, or they can be used with a portable watering cart with direct fill links attached to a cart hose. Admittedly the technician or operator would use a smartphone or tablet as a wireless communications interface with this invention. However, it is common practice for a technician or operator to use a wireless smartphone or tablet in a prior art situation to determine which batteries to water and perhaps to record a watering procedure. Although the use of a wireless communications interface, such as a smartphone or tablet, provides greater utility when used as part of applicant's invention, the operator's task is not seriously complicated and is relatively intuitive.

An advantage of the apparatus, system and method of this invention is that it can be used with multiple batteries in different environments and locations. For example, this battery watering device can be employed to refill a number of batteries that are part of a bank of interchangeable batteries, such as that shown in Prior Art FIG. 1A. Multiple batteries in such a bank can be charged and switched with batteries used in vehicles, such as lift trucks or forklifts or golf carts that employ electrolyte batteries as a source of continuous power. Alternatively this apparatus can be used to refill batteries during normal servicing of vehicles employing such batteries. U.S. Pat. No. 9,376,298 is a typical example of such a battery powered forklift vehicle with which this apparatus can be employed. U.S. Pat. No. 9,376,298 is incorporated herein by reference.

The flow meter equipped direct fill link or watering gun according to this invention also does not encounter some of the potential problems that may be encountered if sensors are mounted on individual batteries. A sensor mounted on a battery will draw current from the battery. While the drain may not be large, it can reduce battery life. With the device and system of the present invention, it is easier to confirm that the system is actually working and operating and collecting data because of visual real time feedback. The device according to this invention will not be subject to damage during battery changeout. A monitoring sensor on a battery can be damaged when a battery is removed or installed on a vehicle. The flow meter or direct fill link or watering gun is also easier to install or replace if there are problems. Since the flow meter of the instant device can be used with multiple batteries, it is economically feasible to use a more accurate flow meter than would be possible if individual flow meters and/or sensors are affixed to each battery. Therefore a user can get an accurate flow total over the entire range of flow rates encountered in filling multiple cells in each battery. Flow rates can vary during a watering with a single point watering system as cells fill and cheaper flow measurement components cannot measure the entire range accurately. For example, the starting flow rate can be two to three gallons per minute and drop to 0.25 gallons per minute when only one cell remains to be filled. Although the battery data upload is automatic it is not real time. Prior art systems require wireless access points setup throughout a plant or facility so each system can upload its new records only when in range resulting in an additional cost. The instant invention disclosed herein does not complicate battery refilling procedures and it is suitable for use in small facilities as well as in large warehouses or facilities where a failed battery can result in downtime or temporary loss of a vehicle, which can interfere with throughput and processes which must be kept on schedule. The apparatus and system according to the invention disclosed herein, also does not complicate or require significant changes in established procedures and will not require significant training of inexperienced employees. Furthermore this apparatus can be used by those who wish to document watering procedures on an interactive database as well as users who intend to manually document these procedure on paper forms or stickers attached to each battery.

Traditional direct fill links and watering guns utilize a spinning wheel or spinning balls flow indictor to tell the operator when water is flowing. The current invention improves upon that by adding a flow sensor in line with the water flow to the direct fill link or watering gun. The flow sensor can be chosen from several different technologies. The preferred embodiment would be a flowmeter (Paddle wheel, Turbine, Oval gear, Ultrasonic, orifice) to gather and totalize water flow during the watering event. Alternate technologies would be a flow switch (shuttle, paddle, piezo) which just gives an indication of flow or no flow. In the preferred embodiment, the flowmeter will display the current flow rate while using the flow rate reading and meter cross sectional area to totalize the water flow during the watering event time period. The flow sensor is also able to communicate these process data readings over a wireless network such as Bluetooth low energy, ZigBee, WiFi or other wireless protocols. The advantage to Bluetooth low energy and ZigBee is the low power requirements allowing the flow sensor to be battery powered with relatively long battery life.

BRIEF DESCRIPTION OF THE DRAWINGS

FIGS. 2A and 2B are views of a standard direct fill link with a flow meter mounted on the direct fill link in accordance with this invention. FIG. 2A shows is an assembly view of a direct fill link, and FIG. 2B is an exploded view of the same device. The flow meter of FIGS. 2A and 2B includes a visible alphanumeric display.

FIGS. 3A and 3B are views of a direct fill link or nozzle or injector, that can be used to fill a multi-cell battery through a single point watering system or assembly, such as that shown in FIG. 1. FIG. 3A is an assembly view of the direct fill link and FIG. 3B is an exploded assembly view showing the primary components that are assembled to form the direct fill link. FIGS. 3A and 3B include a flow meter with a visible paddle indicator that is visible instead of an alphanumeric display of the type employed in FIGS. 2A and 2B.

FIGS. 4A and 4b are views of a direct fill link or nozzle employing a flow meter with a digital output signal showing the cumulative flow and another flow indicator, such as a paddle wheel, which can give the operator an easily detectable indication. The flow meter displays a signal indicating the cumulative flow and the other flow indicator, such as a paddle wheel, can give the operator a more easily detectable indication that there is flow through the device. FIG. 4A is an assembly view of the direct fill link and FIG. 4B is an exploded assembly view showing the primary components that are assembled to form the direct fill link.

FIG. 6 is a view of a watering gun that can be used instead of the direct fill link of FIGS. 2A and 2B if the individual cells are filled one at a time. A flow meter or similar sensor can be employed with this watering gun if a single point watering system is not used.

FIG. 8 is a flow chart demonstrating the sequential step of the system and method employing the apparatus of this invention.

DETAILED DESCRIPTION OF THE PREFERRED EMBODIMENT

Figure 1:
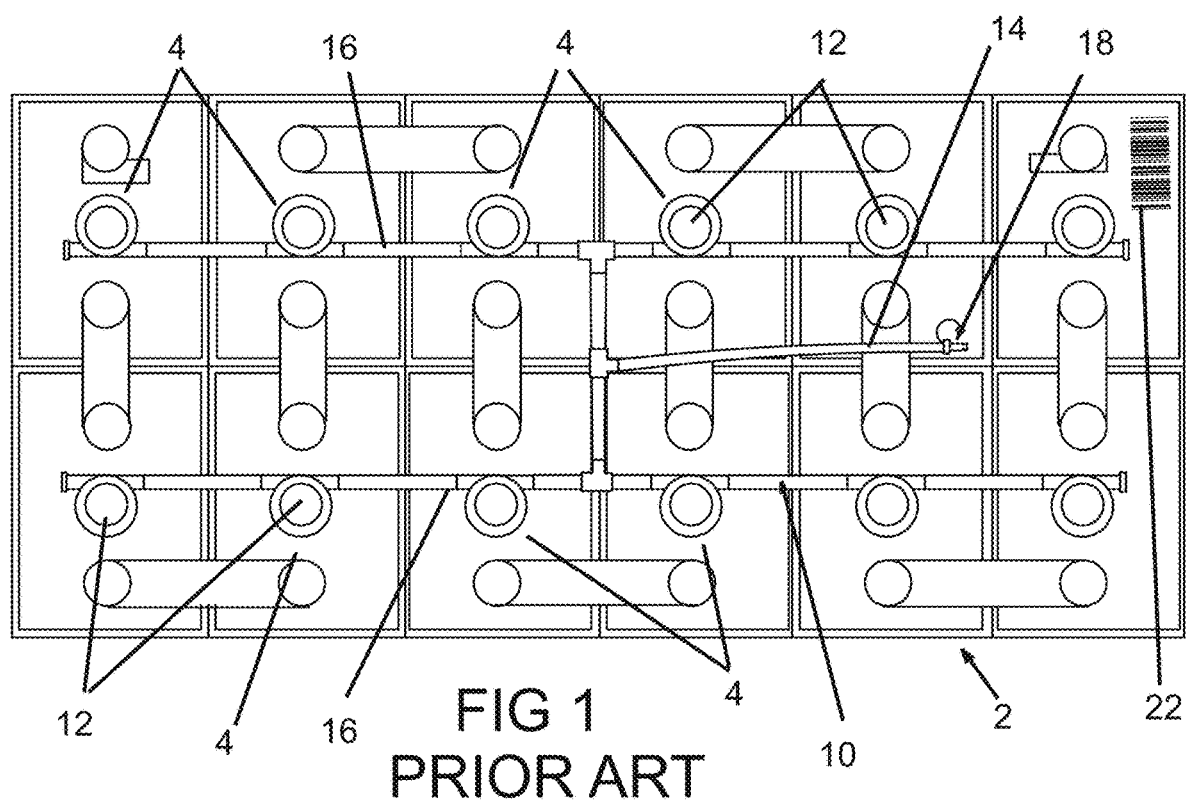
FIG. 1 is a view of a conventional multi-cell electrolyte or lead acid battery with a single point watering system or assembly mounted on the battery so that all of the battery cells can be filled through a single input or feed tube.
Figure 1A:
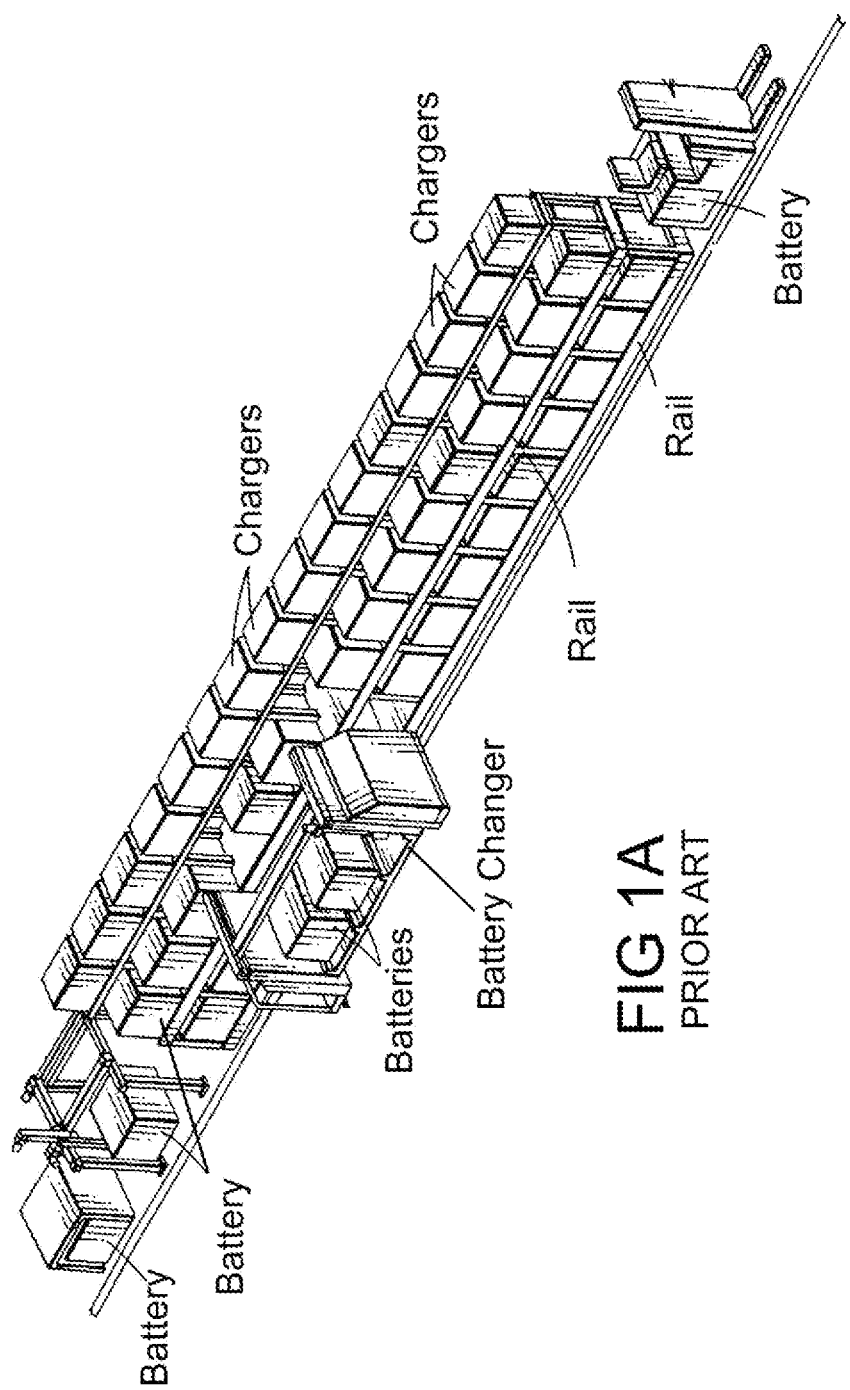
FIG. 1A is a view of a conventional bank of batteries with chargers that can be maintained for powering vehicles so that batteries can be interchanged in normal operations.

The preferred embodiment of this invention is especially suited for use with a single point watering system or assembly. Single point watering systems or systems 10 are commonly used with batteries, such as electrolyte or lead acid batteries 2 that require the replenishment or refilling of fluid, such as water, and are depicted in FIG. 1. Batteries of this type commonly have a number of cells, and each cell 4 will from time to time require watering. However, the amount of water that must be added to individual cells of the same battery may not equal to that needed for other cells in the same battery. Single point watering subsystem or assemblies typically employ valves 12 mounted in each battery cell 4. Filling valves 12 monitor the level in each cell and will shut off when the electrolyte in the cell reaches a proper level. Valves 12 of this type typically use a float system to monitor fluid level, but other methods can also be employed. In this fashion, multiple cells 4 are being filled at the same time using a single point watering system or assembly 10. If valves 12 are employed in single point watering systems, a system of fill tubing is connected to all of the filling valves in a single point watering subsystem or assembly 10. FIG. 1 shows a typical system in with the fill tubing subassembly includes a single input fill tube 14 that is connected to branch fill tubing 16, which then deliver fluid or water through the individual fill valves 12 to associated battery cells 4. In this way fluids, such as water, can be delivered to each cell of a multi cell battery by inputting water or other fluid at one location through the input fill tube 14. Normally a single input fill tube is used with multiple branch fill tubing, but it is possible to employ a single point watering assembly in which all of the fill valves are serially mounted on a single fill tube. In either case, a plurality of cells 4 and associated valves 12 would be fed from a single input. In rare situations employing a large number of battery cells, it would be possible to employ multiple fill tube subassemblies with a single battery, but the same principle would still apply. Single point watering systems have been found to be an efficient means for filling batteries with water especially in installations, facilities or fleet employing a large number of batteries. Examples would be warehouse employing a large number of fork trucks and similar equipment or for golf courses having a large number of battery powered golf carts. Single point watering systems can be used with different batteries, which can have different numbers of cells. The battery shown in FIG. 1 has twelve cells. Single point watering systems suitable for batteries with different numbers of cells can experience variable flow rates during watering. The variability of the flow rate gets more complicated as the number of cells on a battery increase. Industrial batteries can typically have twelve, eighteen, twenty-four, thirty-six or forty cells. In a forty cell battery there might be no flow through some of the valves while the valves on other cells will receive flow until they shut off. Then flow would start to remaining cells. At some point only two or three cells may still be receiving flow until the final cell is full and that valve too closes and the refilling process is completed. Flow meters, such as flow meter 40 employed in the preferred embodiments of this invention, must be capable of determining the cumulative flow rate throughout the complete refilling process. Because the flow rate can be variable during any refilling procedure, this cumulative flow rate may be the integral of the flow rate over the time required to completely fill the battery. In the preferred embodiment of this invention a single flow meter, such a flow meter 40, will be used in conjunction with a fluid dispensing member or nozzle to fill all of the cells of multiply batteries, one battery after another.

The preferred embodiment of this invention employs a fluid dispensing member 30 or direct fill link or nozzle or injector that can be used in conjunction with a flow meter 40. When used with a conventional single input watering system or assembly 10, this flow meter 40 provides input to an Internet based interactive application including an interactive database to monitor the status of a fleet of batteries 4 and to provide data for analysis of the state of existing batteries. This system is also used to schedule watering and other actions for the many batteries in a fleet or in an industrial material handling facility. This embodiment is shown in FIGS. 2A and 2B. The new fluid dispensing member 30 measures the cumulative volume of water or other fluid that is added to each battery 2 when this nozzle 30 is connected to the single point watering subsystem or assembly on that particular battery. The assembly including the nozzle 30 shown in FIGS. 2A and 2B also includes a flow meter 40 to measure the cumulative volume of water added to battery 2 when the nozzle 30 is attached to the single input watering subsystem or assembly 10 mounted on that battery 2. A visible display 41 on the flowmeter 40 will stop incrementing when all of the cells in a battery are filled and the valves on a single point watering system close. If the single point watering system and the fluid dispensing member are joined by a quick connector, flow to the battery will stop and the operator can use the visible feedback to release the handle 34 and switch between an operative and an inoperative state. In this manner the operator or technician has both started the filling process and stopped the filling process which will be detected by the App and the interactive database. Cumulative volume data output from the flow meter 40 on the new nozzle 30 is communicated to the monitoring application or APP, such as a cloud based interactive computer application through a communications interface, such as a wireless device. In the preferred embodiment, this cumulative volume output data is communicated wirelessly to the interactive application and database for each battery. When filled, each battery is then disconnected from the nozzle 30, which is then used to fill the next battery 2. Since the interactive application knows when the filling task for one battery has been completed, data transmitted for the next battery is independent of the data for any of the other batteries in the fleet.

The fluid dispensing member 30 employs a flow meter 40 instead of a flow indicator 40*a* as used in the nozzle 30*a*. The flow meter 40 is mounted to a nozzle body 32 which includes an actuator handle 34 for starting and stopping flow through the nozzle 30. In the preferred embodiment, the flow meter 40 is mounted downstream of the nozzle body 32, although the flow meter 40 could be mounted upstream of the nozzle body 32. In the preferred embodiment the flow meter 40 is positioned downstream of a pressure regulator 33 which maintains a constant pressure regardless of the pressure input from the supply hose 8. The regulator is needed so that the single point watering subsystem and its components will not be damaged or malfunction as the input pressure from the supply and through the supply hose can be up to 90 psi. The fitting 36 will mate the pressure regulator 33 and the nozzle 30 to a supply hose 8 in the same manner as for nozzle 30*a*. The nozzle body 32 is adapted for use with the specific flow meter 40 that may be employed. For example, the length of the nozzle body 40 and the geometry of the fluid passage through the nozzle body will be chosen to provide stable flow through the specific meter 40, based on specifications for that flow meter. The nozzle outlet and connector 38 will also mate with the input fill or feed tube opening 18 of the existing single input watering subsystem or assembly 10 on the battery being watered. The nozzle outlet and connector 38 can of course be chosen to mate with the input fill tube opening or mating connector of the single input watering subsystem or assembly 10 used on each different types of battery, although generally all batteries in a given fleet or facility will be the same.

Flow through the fluid dispensing member 30 into a single point battery watering subsystem 10 is detected only when the fluid dispensing member is in an operative state. When the nozzle 30 is in an inoperative state there is no flow through the nozzle 30, although fluid may still remain in all or part of the nozzle 30. The operative state may be initiated by the actuator handle 34 to open the nozzle 30 and when the actuator handle is returned to its closed state, the nozzle 30 will be in an inoperative state. In other words, the nozzle 30 can be opened and closed. An alternate method of switching between an operative state and an inoperative state is to open and close the connection between the nozzle 30 and the single point watering subsystem 10, which can be done with a quick connector 38 to 18.

In the preferred embodiment the flow meter 40 has a rotor that is located within the flow meter bore through which fluid flows. As is well known, the rotational velocity of the rotor is proportional to the fluid velocity passing through the flow meter bore between the supply hose 8 and the nozzle outlet 38, and then into the single input fill tube 14 to which the nozzle 30 is attached. If the flow rate employs rotor blades of high permeability an inductive sensor, such as a Hall effect sensor, in the flow meter can count the number of revolutions that will be proportional to the volumetric flow rate through the flow meter 40. The flow meter can then be calibrated so that the cumulative volume of flow through the flow meter 40 will also be determined by the number of pulses that are counted by the flow meter 40.

An alternate embodiment of a watering device 30*a* that can be used with a single point watering subsystem or assembly 10, is shown in FIGS. 3A and 3B. A typical water delivery device or injector 30*a* that can be used with existing single input watering system is shown in FIGS. 3A and 3B. This prior art direct fill link has a built in flow indicator 40*a* and pressure regulator 33*a*. The pressure regulator 33*a* reduces water pressure from a maximum of ninety psi from the source to protect and insure proper operation of the fill valves or other components of the single input fill assembly. This prior art direct fill link or nozzle 30*a* is attached to a supply hose 8 by a fitting 36*a* and has a nozzle body 32*a*. The nozzle body 32*a* includes an actuator handle 34*a*, which when depressed opens a bore in the nozzle body 32*a* and water or other fluid will flow through the direct fill link 30*a* at a regulated ten psi. Normally the actuator handle 34*a* if fully depressed and the nozzle bore is fully opened throughout the filling procedure. Direct fill link 30*a* also includes a flow indicator 40*a*, preferably in the form of a paddle wheel that is visible through a clear cylindrical outer body. Rotation of the paddle wheel will be visible to an operator, who then knows that water or another fluid is being delivered to partially empty battery cells 4. When the flow indicator stops rotating, the operator can see that flow has stopped and therefore all of the cells 4 connected through a single point watering subsystem or assembly 10 have been filled because all of the valves 12 are closed. An advantage of this type of flow indicator 40*a* is that the operator can easily see the rotating paddle or wheel and can tell when water if flowing. The direct fill link 30*a* includes a nozzle outlet and nozzle connector 38*a* that mates with the input fill or feed tube opening 18 employing a quick connector for the battery being filled. Appropriate mating connectors can be mounted on the prior art direct fill link to match the input fill tube configuration on the battery being watered. This flow indicator 40*a* does not employ a visible alphanumeric display, this flow indicator does employ circuitry to track the volumetric flow and flow rate through the flow indicator 40*a*. The flow indicator or meter 40*a* communicates this data in the same way as the flow meter 40 in the embodiment of FIGS. 2A and 2B.

Another alternate embodiment of a watering device, nozzle or injector that can be used with a single point watering subsystem or assembly 10 is shown in FIGS. 4A and 4B. This watering device includes both a flow meter 40*b* and a flow indicator 41*b*, preferably in the form of a paddle wheel that is visible through a clear cylindrical outer body. Flow meter 40*b* can be identical to flow meter 40. Flow indicator 41*b* can be identical to flow indicator 40*b* or it can merely include a visible paddle of spinner to provide additional visual input to the operator. An advantage of using both a flow meter 40*b* and a flow indicator 41*b* is that the flow indicator 41*b* is easier for an operator to see in various environments than the flow meter 40*b*. Rotation of the paddle wheel is readily apparent to an operator, who then knows that water or another fluid is still being delivered to partially empty battery cells. As with the other embodiments, apparatus 30*b* includes a pressure regulator 33*b*. The pressure regulator 33*b* reduces water pressure to insure proper operation of the fill valves or other components of the single input fill assembly. Direct fill link 30*b* is attached to a supply hose 8 by a fitting 36*b* and has a nozzle body 32*b*.

The direct fill link body 32b includes an actuator handle 34b, which when depressed opens a bore in the direct fill link body 32b and water or other fluid will flow through the direct fill link 30b at a regulated pressure. Normally the actuator handle 34b is fully depressed and the direct fill link bore is fully opened throughout the filling procedure. The flow indicator 41b stops rotating at the same time that the visual display on the flow meter 40b, but the operator can more easily see that flow has stopped and therefore all of the cells 4 connected through a single point watering subsystem or assembly 10 have been filled because all of the valves 12 are closed. The direct fill link 30b also includes a nozzle outlet and nozzle connector 38b that mates with the input fill or feed tube opening 18 employing a quick connector for the battery being filled. Appropriate mating connectors can be mounted on the prior art direct fill link to match the input fill tube configuration on the battery being watered.

Figure 5:
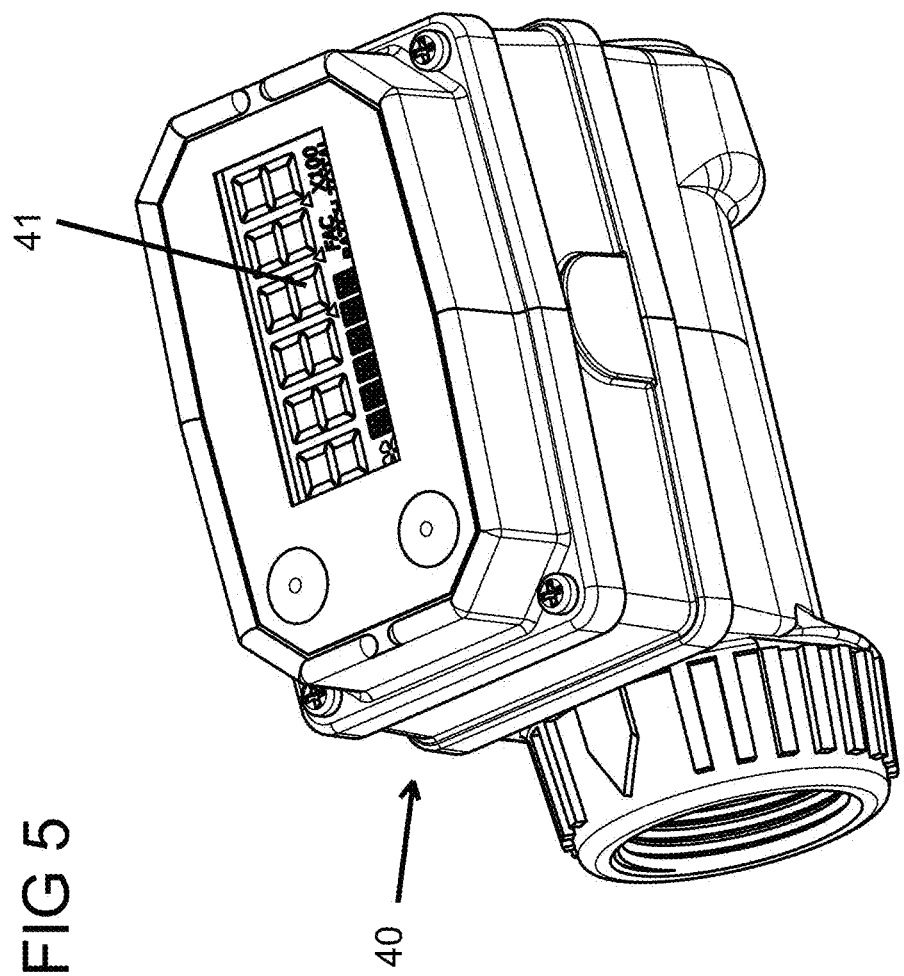
FIG. 5 is a view of a flow meter with a visible output display that can be employed in the direct fill link or nozzle or injector comprising the preferred embodiment of this invention.

Flow meter 40 employed in the preferred embodiments of this invention is shown in FIG. 5. This flow meter includes a flow meter data output member 41 with a visible alphanumeric display. In this version of the flow meter 40, this data output member 41 can comprise a display, such as an LCD display, which is connected to a pulse counter in the flow meter 40, and 40b so that the cumulative volumetric flow between the opening and the closing of the actuator handle 34b can be displayed. A display can then serve as a communications interface. A signal representing the cumulative flow through the flow meter, 40 can then be transmitted to a wireless device, such as a smartphone or tablet used by the operator. Although the flow meter 40a shown in FIGS. 3A and 3B does not have a visible alphanumeric display, it would also include electronics for counting and sending a signal representative of the cumulative volumetric flow rate. The wireless device programmed with an appropriate App can capture a signal transmitted by the flow meter or the wireless device can interrogate a flow meter and receive the signal. The wireless device, can also capture the image on the display and wirelessly transmit the value of the flow through the nozzle 40 and into the battery cells 4 to an interactive application or an interactive database. In the preferred embodiment, the flow meter employs a wireless interface which sends data over a wireless protocol, such as Bluetooth Low Energy or Bluetooth LE or BLE to the interactive application or interactive database. A data record for the specific battery can then be automatically updated. An example of a flow meter that can be employed in the preferred embodiment of this invention could be a commercial or industrial flow sensor, such as the Flomec Series A1 commercial grade flow sensor.

The preferred embodiment of this invention does employ a Bluetooth LE enabled flow meter 40. In the preferred embodiment of this invention most of the Bluetooth LE standard can be bypassed by using only the advertising packet containing the Device Name, serial number, current volumetric flow total and battery level. Although this device is not connectable from a Bluetooth Low Energy standpoint, the advertising packets broadcast from the flow meter 40 can contain all relevant data and be received by a smartphone or tablet application. In this manner configuration of the Bluetooth LE enabled device is unnecessary and multiple listeners can be enabled if needed. Use of an alternate Bluetooth LE enabled device is suitable for this application because even if multiple flowmeters are in range (which would be a rare occurrence), the operator and the operative wireless device, smartphone, tablet or other communication interface can listen only to the flow meter that the operator is using.

Bluetooth Low Energy is a complicated specification which provides for many types of devices to share data without a lot of configuration, if any. The standard is a combination of advertising packets which are broadcast to all in range and device specific information which typically requires a one to one connection between devices. The BLE enabled flow meter of the current invention only needs to relay the cumulative flow as a function of it activation time. This BLE enabled flow meter keeps a running total of flow volume (for example 231.334 gallons of water have gone through that flow meter at time T(n)). The BLE enabled flow meter can continue to broadcast that data and its identity to anyone in range. The application resident on the interactive database application receives an indication of when an operator begins a specific watering event as well as receiving the identity of the specific battery being watered. The application resident on the interactive database application and/or the communications interface also receives or grabs updates and calculates the current to date flow associated with that watering or refilling event. The application resident on the interactive database keeps updating this cumulative flow total value until the operator indicates that the watering event is complete by double tapping on a screen button on a smartphone or tablet or any other communications interface device. The BLE flowmeter 40 only needs to be active or received during each watering process. There is no need to read the flow meter during other tasks or whenever the applications on the communication interface and interactive data base are active and otherwise employed. The process of setting up a complete BLE connection is more complicated and time consuming than just looking for BLE advertising packets. If for some reason the connection is interrupted during watering, a BLE system application according to the complete Bluetooth LE specification would have to sense the interruption and attempt to reconnect/reset the connection. By only employing the advertising packets, the system application employed in the preferred embodiment of this invention is simpler. When a watering task is started, the smart communication interface, such as a smartphone or tablet, starts scanning advertising packets looking for the flowmeter using a combination of the device name and serial number to identify the active flow meter and battery of interest. When the communications interface or smartphone has the BLE advertising packet, it has the data. The application resident on the smartphone, tablet or other communications interface device can then continue to look for Bluetooth LE advertising packets. If one advertising packet is missed during the refilling process, it does not matter because the next advertising packet will have the needed data. As long as the software application resident on the communications interface device can grabs one packet at the beginning of the refilling or watering process and one packet near the end of the refilling process, these advertising packets will supply sufficient data to record the volume of liquid added to the battery cells with adequate specificity.

Alternatively a flow meter suitable for use in the nozzle, injector or direct fill link 30, 30a or 30b could employ a venturi sensor. Another version could be a simple valve or gate that could be opened and closed and the cumulative volume could be determined as a function of the diameter of the flow bore and the time that the valve or gate remains open. Of course this simpler approach would not be quite as accurate, and may only be suitable for applications in which a high degree of accuracy is unnecessary. However for applications involving batteries using a single point watering subsystem or assembly to fill multiple cells, an accurate flow meter of the type employed in the preferred embodiment could be more suitable. A number of cells 4 are filled during each event, and the amount of water needed in each cell 4 will most likely differ that that needed in other battery cells 4. This means that the flow rate through the flow meter 40 will vary during each fill event, and the additional accuracy provided by flow meters that would be used for multiple batteries and filling events would be beneficial. Flow meters 40 of the type employed herein would tend to be more expensive than flow sensors of the type attached to each battery in the system disclosed in U.S. Pat. No. 10,326,171. However, only a single nozzle 40 need be used to fill a large number of the batteries 2 in a given fleet or facility, only one sensing device would be necessary. Thus additional accuracy can be obtained, probably for less cost.

Instead of using a single point watering system the individual cells of a battery, a watering gun 65 can be used. The filling apparatus 60, shown in FIG. 6 can employ such a gun 65 to inject water or a fluid directly into individual battery cells 4, and the apparatus 60 can employ the same or a compatible flow meter 70 as employed with the smart filling links shown in FIG. 2A. Watering gun 65 employs a head 68 suitable for filling battery cells one at a time. The actuator 62 employs the same handle as used with a watering gun 65, which can be attached to a supply hose by fitting 66. A smart filling apparatus employing a single cell watering gun 65 does not require a pressure regulator.

An interactive Internet, cloud based or server interactive computer application or interactive database in which this system is employed can schedule watering tasks for specific batteries that are to be watered with a nozzle, injector or direct fill link 30 including a flow measuring device, such as flow meter 40. This application can receive wireless updates showing completion of the watering event as well as the cumulative amount of water added when each task is completed. A record of each completed task is stored as part of the history of the maintenance of each specific battery 2. This record can be employed to determine potential problems and schedule preventive maintenance of that battery or indicate that a specific battery has reached or is approaching the end of its service life. The record maintained in this interactive cloud based or server computer application or interactive database, can also be used to prove when scheduled watering tasks have been completed. In addition to these automatic updates, this interactive cloud based or server computer application or interactive database can still receive comments from technicians and administrators with suitable access in the same manner as conventional computer applications of this type.

The interface between the interactive cloud based or server computer application or interactive database and the nozzle 30 and flow meter 40 would preferably be a wireless interface. For example the communications interface could employ a wireless protocol, such as Bluetooth LE. A smartphone or tablet could also be used as the communications interface. An advantage of employing a smartphone or tablet is that technician performing the watering task can use a smartphone or tablet to view the record for the specific battery 2 that is being serviced. A smartphone or tablet can also be used to identify the specific battery by acquiring an image of a unique identifier or indicia on each battery. For example, an identifying, unique indicia 22, such as a bar code shown in FIG. 1, could be applied to each battery and imaged at the start of each task. Alternatively, a scanner communicating with the smartphone or tablet could be used to identify the specific battery.

This interactive application is also designed to keep track of required maintenance of industrial equipment, such as batteries. It is used to intelligently automate, track and monitor the maintenance on batteries, chargers and forklifts, and provides management, automation and data visibility. This application can be customized to meet company specific requirements. A battery distributor can create an end user account identifying an Administrator (Admin) at the end user level with full access to the website. Multiple individuals with specific multi-level access levels can be assigned. Capabilities to add, modify and retire equipment can be assigned and access to specific facilities and sections where equipment to services are located can be assigned or restricted. However, entry of watering data using this system is automatic when watering is performed and completed, and is independent of user input or contamination. This independent record also provides corroboration that the watering task has been completed as scheduled, as well as providing input for further programmed tasks or indications of battery health, based on the amount of water added.

Figure 7A:
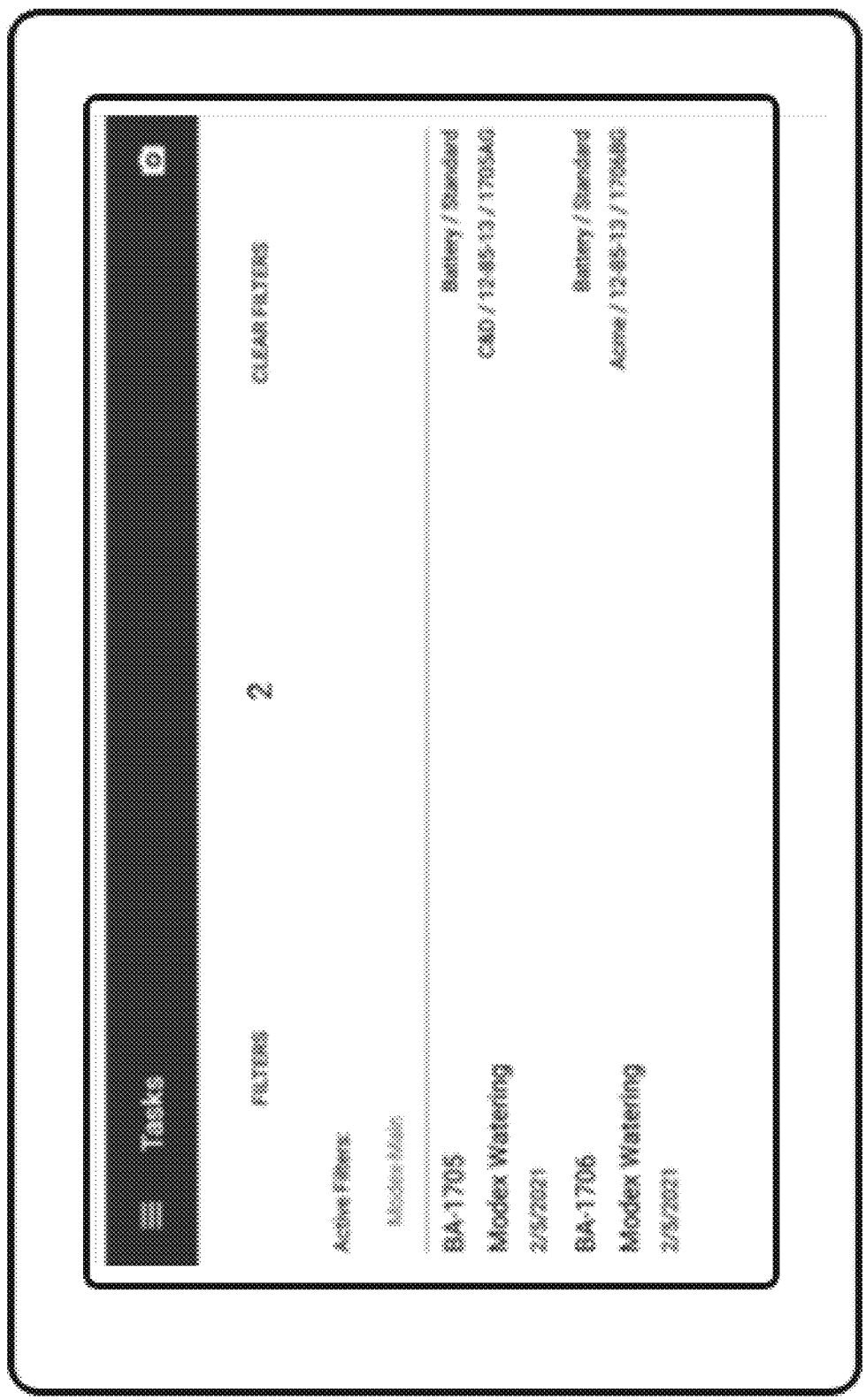
FIGS. 7A and 7B are screen shots of cell phone or smartphone or tablet displays showing data employed in the cloud or server based interactive computer application or interactive database according to this invention.

A smartphone or tablet interface for this application and the watering task will also provide essential or merely useful data to a technician performing the watering task. FIG. 7A is view of a smartphone or tablet identifying and displaying multiple batteries and their status, including if and when a particular battery is to be serviced by adding water to fill the battery. The operator performing the watering task can use this display to determine which batteries are in need of servicing. When the operator has selected an appropriate task, for example by touching the screen, the display shown in FIG. 7B will be available on his or her smartphone or tablet. Alternatively a notice can be sent to the operator's smartphone or tablet instructing him or her to locate a particular battery and fill that battery. When the operator has completed the particular task as indicated by the flow meter on the filling apparatus, the amount of water added to that particular battery will be transmitted to that cellphone, and the operator will touch the cellphone to indicate completion of the task and transmit that data to the interactive data base. The operator can also incorporate any appropriate comments relative to that particular battery and/or the task that has been completed. For example, if the operator has filled a battery on a vehicle, such as a golf cart, he or she can add comments concerning either the battery or unrelated problems that he or she has noticed during the filling operation. For example, the operator may have noticed that there may be problems with a tire or with a battery cable that require attention.

Figure 7B:
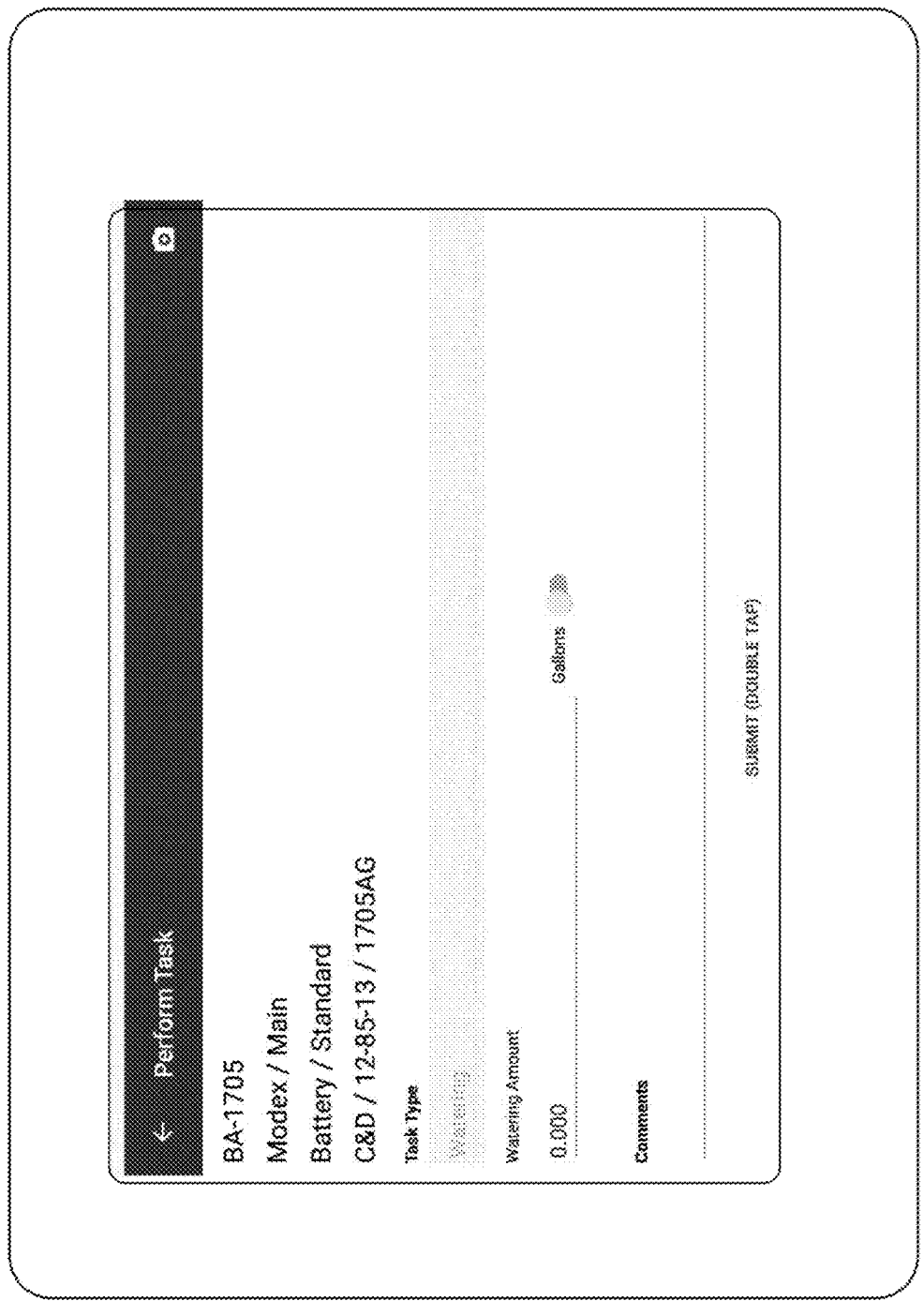

For the interactive database employed in the preferred embodiment of this invention the two screens exemplified in FIGS. 7A and 7B are pertinent to the fluid refilling system of the preferred embodiment. The task list or tasks shown in FIG. 7A is a list of scheduled tasks for an operator. These tasks can be filtered by location (facility or section of a facility), type of equipment and class of equipment or type of task. FIG. 7A shows only battery waterings, although repair task could also be shown. A camera icon is used to initiate scanning of a distinct equipment bar code for each piece of equipment, which is used to initiate the filling process so that the filling process can be documented. The number of tasks, two in FIG. 7A, is also identified.

"Filters" in FIG. 7A is a link to apply filters and "Clear filters" is a link to clear filters. "Active Filters" denotes the number of active filters, and there are none in the example of FIG. 7A.

"Modex-Main" Tasks are grouped by Facility/Section, and there are two pieces of listed equipment in the Modex facility in the Main section. Each piece of equipment with scheduled tasks is then listed. An equipment unit number, such as "BA1705", or nickname is shown on the screen. A generic specification for the type of equipment, such as Battery as opposed to a charger or forklift) is then shown. The Battery shown is a standard class battery. The name of the scheduled task (here "ModexWatering") is setup by an Administrator (Admin) to inform the operator of what task is to be performed for each piece of equipment. If the operator is authorized to schedule specific tasks, he or she may enter appropriate information on his or her smartphone or tablet for inclusion in the interactive database. The equipment manufacturer, model number and serial number for the piece of equipment is included on this screen. This information is primarily for data analysis, but the operator has this information so that he or she could identify any discrepancy in which the specific device is incorrectly identified in the database. The due date is also shown on the screen of FIG. 7A. When the operator is ready to perform a designated task, he or she merely touches the listed task, and the Perform Task screen shown in FIG. 7B appears.

The specific task to be performed is shown on the screen of FIG. 7B, which shows the same information for one of the tasks displayed on the "Tasks" screen of FIG. 7A. The "Task Type—Watering" is greyed out in FIG. 7B because this is a scheduled task. If an unscheduled task is to be performed, the operator could change the task type to identify the task being performed. "Watering Amount" records the amount of water added. If a flow meter equipped with wireless capacity, such as Bluetooth LE or low energy is used, this data indicative the cumulative or total flow rate is directly entered when the task is complete and is displayed on the screen. The operator has the capability of entering this amount either by direct entry of the amount or by scanning the alphanumeric display on the flow meter with the smartphone or tablet equipped with this App. The Gallons slider allows the volume entered to be displayed in gallons or liters. The Comments section allows the operator to directly enter comment for inclusion in the database entry. For example, if the operator notices that one of the valves on the single point watering system appears to be damaged, but he or she does not have a replacement readily available, this maintenance task would be entered for subsequent consideration. The operator then enters "Submit" by double tapping to upload pertinent information relevant to the completed task on the interactive database.

FIG. 8 is a flow chart showing the steps that the operator would perform with the assistance of the APP on the wireless device that he or she employs. FIG. 8 shows the basic operations for use with a Bluetooth enabled flow meter.

The embodiments described and depicted herein are representative of this invention. Modifications to this invention would be apparent to those of ordinary skill in the art, and the invention is defined and only limited by the following claims.

The invention claimed is:

1. An apparatus for sequentially refilling multiple batteries with a fluid, wherein each battery has a plurality of cells which are individually refillable, comprising;
   a fluid dispensing subassembly is attachable to a source of fluid and connectable to and disconnectable from each of the multiple batteries individually one at a time, the fluid dispensing subassembly further comprising;
   a flow meter and a pressure regulator mounted to each other between a hose and a fluid dispensing nozzle;
   the flow meter being capable of measuring the cumulative flow input to all of the plurality of cells in each of the batteries, one battery at a time, through the nozzle and generating at least one signal corresponding to the total amount of fluid passing through the nozzle and detected by the flow meter to each of the batteries, one at a time; wherein the at least one signal is detectable by an operator after refilling each battery is completed and the amount of fluid added to each of the batteries is documented,
   wherein the fluid dispensing subassembly is employable in a batch process for refilling multiple batteries individually suitable for installation in a vehicle or as part of servicing individual vehicles employing as least one of the multiple batteries.

2. The apparatus of claim 1 further comprising a connector mountable on the nozzle to connect the fluid dispensing member to each battery when that battery is refilled, the connector being disconnectable from each battery after refilling.

3. The apparatus of claim 2 wherein the connector is connectable to and disconnectable from a mating connector on a single input fill tube, which is part of a single point watering system mounted on each battery, permitting the plurality of cells on each battery to be refilled through a single input fill tube, the cumulative flow measured by the flow meter comprising the sum total of fluid cumulatively added to all of the plurality of cells in each battery, one at a time.

4. The apparatus of claim 1 further comprising a communication interface for sending the at least one signal output from the flow meter corresponding to the total amount of fluid detected by the flow meter of fluid input to each of the batteries, one at a time, during the operative state to an interactive database record of multiple instances in which each of the multiple batteries has been filled.

5. The apparatus of claim 4 wherein the signal corresponding to the total amount of fluid passing through the flow meter to refill each battery is communicated to an interactive database after each battery is refilled.

6. The apparatus of claim 1 wherein the flow meter includes a visual display, readable by the operator refilling each of the batteries.

7. The apparatus of claim 6 further comprising a flow indicator in addition to the visual display, the flow indicator also being visible to the operator to separately indicate to the operator completion of refilling of each battery so that the operator can proceed with refilling other batteries.

8. The apparatus of claim 1 wherein the nozzle, the pressure regulator and the flow meter are attached to form a single device.

9. The apparatus of claim 8 wherein the nozzle has an operative state in which fluid flows through the nozzle, but through which fluid does not flow in an inoperative state, the nozzle being switchable between the operative and the inoperative state by the user.

10. The apparatus of claim 1 wherein the flow meter includes a flow rate sensor continually detecting a variable flow rate during the time required to fill each battery, and the total amount of fluid passing through the flow meter to fill each battery is the integral of the variable flow over the time required to fill each battery.

11. The apparatus of claim 1 wherein the fluid dispensing nozzle member comprises is part of a watering gun for filling each cell of an individual battery one at a time.

12. An assembly for refilling multiple, individual multi-cell batteries with a fluid, the assembly being separate from each of the batteries, the assembly comprising;
   a subassembly further comprising;

a nozzle having an operative state allowing flow of the fluid through the nozzle and an inoperative state in which flow does not pass through the nozzle;

a nozzle fitting attachable to a hose supplying the fluid for refilling the battery;

a nozzle outlet for delivering fluid to the battery;

a flow meter with fluid passing through the flow meter also passing through the nozzle, the flow meter outputting data indicative of the cumulative flow through the flow meter and into the each individual battery during the nozzle operative state; and a communication interface separate from the subassembly for sending a signal corresponding to the total amount of fluid passing through the flow detector during the operative state of the nozzle and into each individual battery to a data record of multiple instances in which each of the multiple batteries is filled with fluid.

13. A system for monitoring and intermittently watering a fleet of multiple batteries one at a time, each battery of the fleet including a plurality of individual battery cells each of which may require replenishment of possibly different amounts of water, individual batteries being equipped with a battery single point watering subassembly attachable to the individual batteries, the battery watering subassembly comprising a plurality of valves positionable in battery cell vent openings, individual valves being shiftable between an open position to allow fluid to enter a battery cell and a closed position when the fluid level in the individual battery cell reaches a prescribed level; a single input opening on a single fluid input fill tube communicating with branch tubes leading to individual valves so that fluid is introduced through the single input fill tube to the branch tubes and the individual valves only through the single fluid input opening, fluid flow through the fill tube and the branch tubes ceasing after all valves in communication with the conduits close; the system comprising:

a direct fill link attached to a water supply hose and being shiftable between an open and a closed state by a person, water flowing through when the system is in an operative state and the nozzle is open wherein water does not flow through the direct fill link when the system is in an inoperative state or when the direct fill link is in a closed state allowing the fluid to pass through the direct fill link in a controlled manner, the direct fill link being attachable to a hose supplying fluid for refilling the individual batteries when in the operative state sequentially and one at a time;

a direct fill link outlet for delivering water to the input feed tube of individual batteries when placed in communication with the input feed tube on each individual battery one at a time and disconnectable from the input feed tube, after delivering water to that individual battery;

a flow meter mounted on the direct fill link and in fluid communication with the fluid dispensing member for determining the cumulative flow through the direct fill link to fill all of the cells of each individual battery, one at a time;

a flow meter data output member for outputting the cumulative amount of fluid passing through the flow meter and the direct fill link during the operative state;

a communication interface, separate from the direct fill link for providing data corresponding to the total amount of fluid passing through the flow meter to a data record of multiple instances in which each individual battery if refilled;

an interactive database with which the communication interface is communicable for storing the date/time and amount of water added to each individual battery, the interactive database communicating data to and from the communication interface, and distinct indicia on individual batteries being detectable by the communication interface to identify each battery to the database.

14. The system of claim 13 wherein data is wirelessly communicated between the communications interface and the interactive database.

15. The system of claim 14 wherein data is collected from the communications interface comprises a smart phone or tablet separate from the direct fill link.

16. The system of claim 13 wherein the distinct indicia comprises a unique bar code for each battery.

17. The system of claim 13 wherein data for each watering event for each battery need only be stored in the interactive database.

18. The system of claim 13 wherein the interactive database provides outputs for scheduling additional watering events based on the previous history of watering events for individual batteries.

19. The system of claim 13 wherein communication of watering events flow data for individual batteries to the interactive database occurs only from the flow meter through the communication interface.

20. The system of claim 13 wherein the flow meter generates continuous signals when operative so that the amount of water dispensed to an individual battery is determined by subtracting a first signal at the beginning of a corresponding operative state for that individual battery from a second at the end of the corresponding operative state for that individual battery.

21. The system of claim 13 wherein the interactive database is external to the batteries and to the flow meter and data for historical watering events is resident only externally in the database.

22. The system of claim 13 wherein the fluid dispensing member comprises a direct fill link.

23. The system of claim 13 wherein the batteries are motive power batteries.

24. A method of monitoring and refilling a fleet of liquid electrolyte multi-cell batteries each equipped with fill tubes and watering valves mounted on the battery and delivering water to all cells in the battery, the fill tubes comprising a single input fill tube and branch fill tubes leading from the input fill tube to the watering valves in the cells, comprising the steps of:

1) intermittently connecting a fluid dispensing member attached to a water supply hose to the single input fill tube of a single point watering system on individual batteries, one at a time, and disconnectable from the single fill tube after water is delivered thereto;

2) shifting the fluid dispensing member to an operative state in which water is injected through the single input fill tube until all of the cells are filled;

3) measuring the cumulative flow rate of water passing through the fluid dispensing member on a flow meter mounted on the fluid dispensing member during the operative state:

4) outputting, from the flow meter, the cumulative flow volume required to fill all of the cells on the battery to which the fluid dispensing member is communicable to a communications interface separate from the fluid dispensing member; and 5) communicating the cumulative flow data to an interactive external database storing information for the battery being filled and other batteries in the fleet:

6) Repeating steps 1-5 for other batteries in the fleet.

25. The method of claim 24 wherein the cumulative flow data is wirelessly communicated to the interactive external database through the external communications interface.

26. The method of claim 24 wherein each battery is identified by a unique indicia on each battery and the unique indicia on each battery is communicated to the external database along with communication of the cumulative flow data to maintain a record for each battery in the fleet.

27. The method of claim 25 wherein the external database and the external communications interface transmit data concerning specific batteries to and from each other.

28. The assembly of claim 12 in which the communications interface and the data record also transmit and receive flow data generated by a watering gun filling each cell of a battery, one at a time.

29. The system of claim 13 in which the communications interface and the interactive database also transmit and receive flow data generated by a watering gun filling each cell of a battery, one at a time.

30. The assembly of claim 12 wherein comments concerning a battery being filled, including maintenance history and maintenance issues, can be entered by a technician through the communications interface and stored on the data record for display when the battery is next filled.

31. The system of claim 13 wherein comments concerning a battery being filled, including maintenance history and maintenance issues, can be entered by a technician through the communications interface and stored on the interactive database for display when the battery is next filled.

32. The method of claim 25 wherein comments concerning a battery being filled, including maintenance history and maintenance issues, can be entered by a technician through the external communications interface and stored on the external database for display when the battery is next filled.

* * * * *